(12) United States Patent
Tseng

(10) Patent No.: US 10,014,310 B1
(45) Date of Patent: Jul. 3, 2018

(54) MEMORY CELL STRUCTURE AND OPERATION METHOD THEREOF

(71) Applicant: UNITED MICROELECTRONICS CORP., Hsin-Chu (TW)

(72) Inventor: Yuan-Heng Tseng, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/638,377

(22) Filed: Jun. 30, 2017

(51) Int. Cl.
| | |
|---|---|
| *G11C 11/34* | (2006.01) |
| *H01L 27/11563* | (2017.01) |
| *H01L 29/78* | (2006.01) |
| *H01L 29/792* | (2006.01) |
| *G11C 16/04* | (2006.01) |

(52) U.S. Cl.
CPC .... *H01L 27/11563* (2013.01); *G11C 16/0466* (2013.01); *H01L 29/785* (2013.01); *H01L 29/792* (2013.01)

(58) Field of Classification Search
CPC .......... G11C 16/0466; H01L 27/11563; H01L 29/785; H01L 29/792

USPC .................. 365/174, 171, 63, 185.05, 185.03
See application file for complete search history.

(56) References Cited

U.S. PATENT DOCUMENTS

| | | | |
|---|---|---|---|
| 7,692,961 B2 | 4/2010 | Eitan | |
| 7,903,458 B1 * | 3/2011 | Jenne | G11C 16/3418 365/185.02 |
| 8,891,299 B2 * | 11/2014 | Chang | G11C 16/10 365/185.03 |
| 9,768,231 B2 * | 9/2017 | Tran | H01L 27/2436 |
| 9,786,598 B2 * | 10/2017 | Kim | H01L 21/764 |

* cited by examiner

*Primary Examiner* — Gene Auduong
(74) *Attorney, Agent, or Firm* — Winston Hsu

(57) ABSTRACT

A method for operating a memory cell structure includes providing a memory cell. An erasing process is performed by applying an erasing voltage to a first gate electrode, a source region and a drain region simultaneously to attract a plurality of electrons from a substrate and to store the plurality of electrons in a first spacer and a second spacer. Afterwards, a programming process is performed by applying a pull-out voltage to the source region or the drain region to remove the plurality of electrons stored in the first spacer or the second spacer, and a read process is performed to determine whether the plurality of electrons is stored in the first spacer and stored in the second spacer.

17 Claims, 5 Drawing Sheets

| | | WL1/WL2 | BL' | BL |
|---|---|---|---|---|
| Erasing Mode | select | V1 | V1 | V1 |
| Programming Mode | select bit 1 | F | F | V2 |
| | select bit 2 | F | V2 | F |
| | un-select | V3 | F | F |
| Read Mode | select bit 1 | Vcc | 1 | 0 |
| | select bit 2 | Vcc | 0 | 1 |
| | un-select | F | F | F |

2bit/cell

FIG. 7

MEMORY CELL STRUCTURE AND OPERATION METHOD THEREOF

BACKGROUND OF THE INVENTION

1. Field of the Invention

The present invention relates to a semiconductor structure, and in particular, to a non-volatile memory cell structure and the operating method thereof.

2. Description of the Prior Art

Demand for non-volatile memory (NVM) devices, including embedded NVM in other microelectronics and IC devices, has grown rapidly in recent years due to the expansion of digital computing and processing beyond desktop computer systems to include a broader array of consumer electronic, communications, automotive and industrial products. These products include mobile phones, still and video digital cameras, personal digital assistants (PDAs), portable computers, portable digital music players, digital video recorders, set-top boxes, communication routers and switches, digital televisions and other electronic systems. Each of these products typically requires one or more nonvolatile memory device(s) to store data, such as the product's operating system and may also require data storage capabilities.

SUMMARY OF THE INVENTION

The present invention provides a memory cell structure, the memory cell structure comprises a substrate, having a fin structure disposed thereon, a first gate structure and a second gate structure disposed on the substrate, a first spacer and a second spacer disposed between the first gate structure and the second gate structure, wherein the first spacer is disposed on one sidewall of the first gate structure, and the second spacer is disposed on one sidewall of the first gate structure, an epitaxial layer, disposed between the first gate structure and the second gate structure and disposed in the fin structure, and a plurality of electrons disposed in the first spacer and the second spacer, wherein the first spacer and the second spacer comprise silicon nitride, silicon carbon nitride (SiCN), silicon oxide (SiO2), silicon oxynitride (SiON), or silicon carbon oxynitride (SiOCN).

The present invention further provides a method for operating a memory cell structure. The method comprises: Firstly, a memory cell is provided, wherein the memory cell comprises a substrate and a first gate structure disposed thereon, the first gate structure comprises a first gate electrode, a source region and a drain region disposed on two sides of the first gate electrode, a first spacer disposed between the first gate electrode and the source region, and a second spacer disposed between the first gate electrode and the drain region. Next, an erasing process is performed, to apply an erasing voltage to the first gate electrode, the source region and the drain region simultaneously, to attract a plurality of electrons from the substrate, and to store a plurality of electrons in the first spacer and the second spacer. Afterwards, a programming process is performed, to apply a pull-out voltage to the source region, and to remove the electrons stored in the first spacer, or to apply the pull-out voltage to the drain region, so as to remove the electrons stored in the second spacer, and a read process is performed, to determine whether the plurality of electrons is stored in the first spacer and stored in the second spacer.

In summary, the applicant found a phenomenon that by applying the voltage to a MOSFET, the electrons can be stored in the spacers of the MOSFET. The electrons stored in the spacers can be removed again by applying another voltage to the source or the drain of the MOSFET. Therefore, the MOSFET can be made into a 1-bit or 2-bit memory cell. The present invention provides the operation method of the memory cell. The structure and the operation method are applicable to the current semiconductor processes.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 7 shows the operation table according the memory device shown in FIG. 6.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
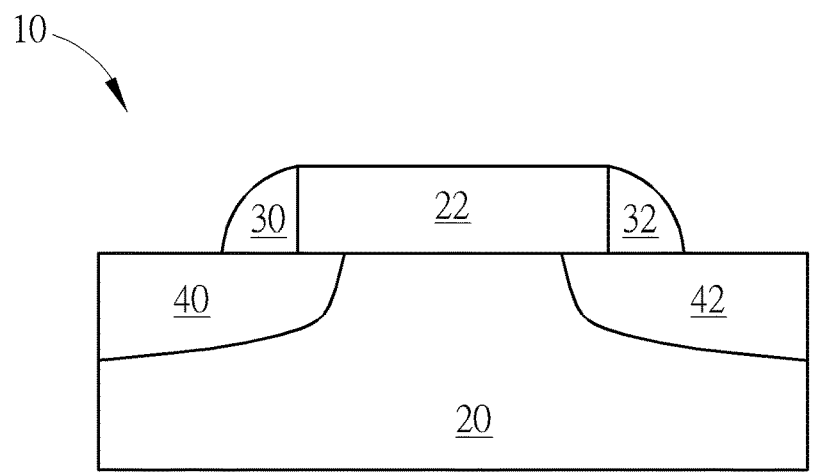
FIG. 1 shows a schematic diagram of the memory cell structure according to one embodiment of the present invention.
Figure 2:
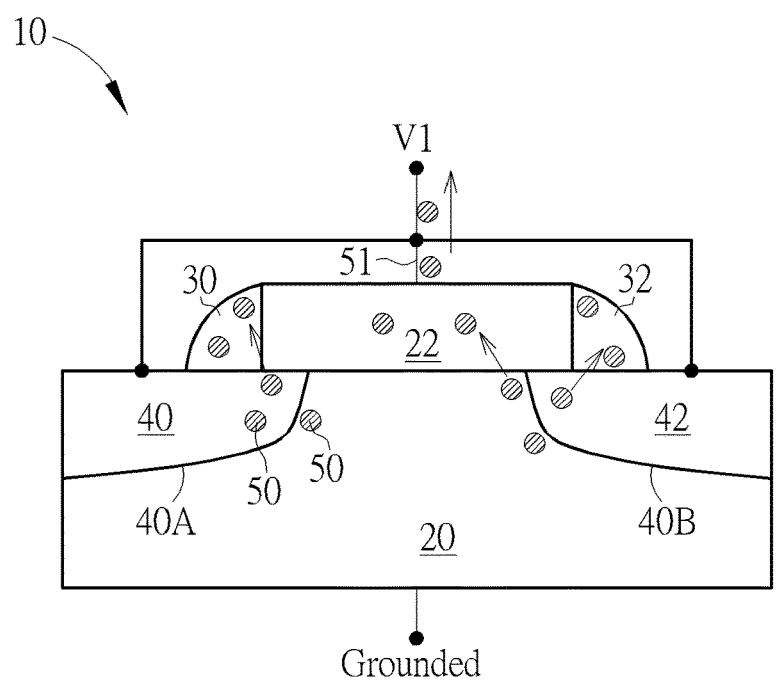
FIGS. 2-4 shows the operating method of the memory cell structure.
Figure 3:
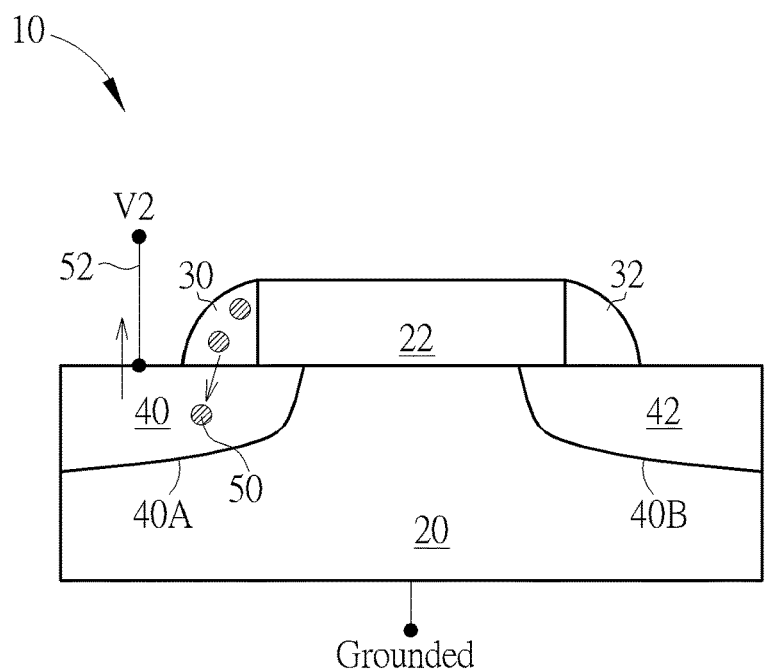
Figure 4:
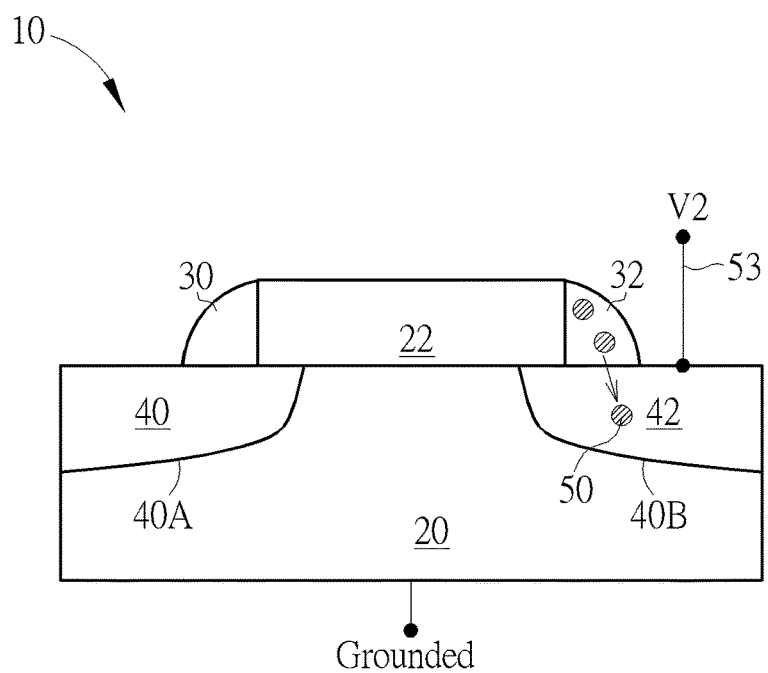

FIG. 1 shows a schematic diagram of the memory cell structure according to one embodiment of the present invention, and FIGS. 2-4 shows the operating method of the memory cell structure. As shown in FIG. 1, a memory cell structure or a MOSFET (metal oxide semiconductor field effect transistor) 10 is provided. In this embodiment, the memory cell structure or the MOSFET 10 includes a substrate 20, a gate electrode 22 disposed on the substrate 20, a source region 40 and a drain region 42 are formed in the substrate 20 and at two sides of the gate electrode 22 respectively, and two spacers disposed on two sides of the gate electrode 22, here defined the two spacers as a first spacer 30 and a second spacer 32 respectively. In the present invention, the substrate 20 may be a silicon substrate or a silicon-on-insulator (SOI) substrate, the gate electrode 22 may be a polysilicon gate electrode or a metal gate electrode, and each spacer (the first spacer 30 and the second spacer 32) may be a single layer structure or a multiple layer structure. Each spacer may include materials such as silicon nitride (SiN), silicon carbon nitride (SiCN), silicon oxide (SiO$_2$), silicon oxynitride (SiON), or silicon carbon oxynitride (SiOCN). In this embodiment, both the first spacer 30 and the second spacer 32 are a single silicon nitride layer, but not limited thereto, it can be adjusted according to actual requirements.

Depending on whether the MOSFET 10 is an n-type MOSFET or a p-type MOSFET, the substrate 20 may be doped to have a n-type resistivity, or may be doped to have a p-type resistivity. For example, when fabricating the p-type MOSFET, phosphorus atoms or arsenic atoms may be doped into the single-crystal silicon substrate to have a doping concentration within a range of $10^{13}$-$10^{18}$ cm$^3$; when fabricating the n-type MOSFET, boron atoms may be doped into the single-crystal silicon substrate to have a doping concentration within $10^{13}$-$10^{18}$ cm$^3$. In this embodiment, taking an n-type MOSFET as an example, the source region 40 and the drain region 42 are doped to have n-type resistivity. On the other hand, if the MOSFET is a p-type MOSFET, the source region 40 and the drain region 42 are doped to have p-type resistivity.

As shown in FIG. 2, the applicant found a phenomenon when the substrate 20 is grounded, and a first voltage V1 (the first voltage V1 can be deemed as an erasing voltage in the following paragraph) is applied to the gate electrode 22, the source region 40 and the drain region 42 simultaneously. While the first voltage V1 is larger than a specific value (for example, such as 7V, but not limited thereto), a plurality of electrons 50 will be "attracted" from the substrate 20 to breakdown the junction 40A between the source region 40 and the substrate 20, and to breakdown the junction 40B between the drain region 42 and the substrate 20, and to be temporarily stored in the first spacer 30, in the second spacer 32 and in the gate electrode 22. However, since the gate electrode 22 is directly connected to a wire 51 that is electrically connected to the first voltage V1, the electrons 50 that stored in the gate electrode 22 will exit through the wire 51, and therefore the electrons 50 are only kept in the first spacer 30 and the second spacer 32.

As shown in FIGS. 3-4, after the electrons 50 are kept in the first spacer 30 and the second spacer 32 respectively, the applicant found that if a second voltage (the second voltage V2 can be deemed as a pull-out voltage in the following paragraph) is applied to the source region 40 or to the drain region 42, and make the gate electrode 22 electrically floated or grounded, the electrons 50 that stored in the first spacer 30 or in the second spacer 32 can be removed again. In the present invention, the second voltage is preferred larger than 5V, or the voltage difference between the source and the gate (or the voltage difference between the drain and the gate) is larger than 5V, but not limited thereto. More precisely, as shown in FIG. 3, a second voltage V2 is applied to the source region 40, and the gate electrode 22 is electrically floated (or grounded), the electrons 50 stored in the first spacer 30 will be "attracted" and flow from the first spacer 30 to outside through a wire 52 which is directly connected to the source region 40. Similarly, as shown in FIG. 4, if the second voltage V2 is applied to the drain region 42, the electrons 50 stored in the second spacer 32 will be attracted and flows from the second spacer 32 to outside through a wire 53 which is directly connected to the drain region 42.

Figure 5:
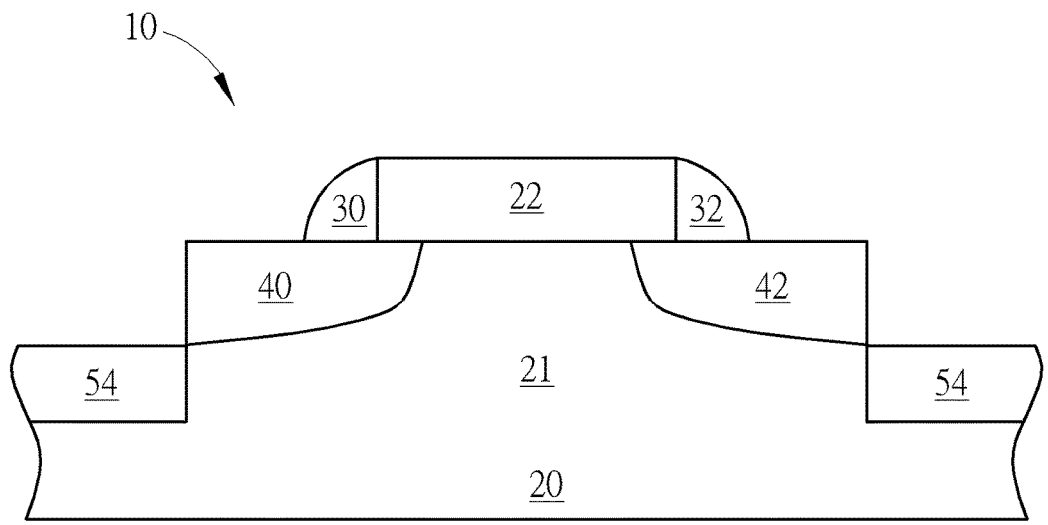
FIG. 5 shows a schematic diagram of the memory cell structure according to another embodiment of the present invention.

The MOSFET mentioned above is a planar MOSFET. However, in another embodiment of the present invention, as shown in FIG. 5, a fin structure 21 is provided and formed on the substrate 20, and at least one shallow trench isolation (STI) 54 is formed surrounding the fin structure 21, the MOSFET 10 can be formed on the fin structure 21. It should also be within the scope of the present invention.

Figure 6:
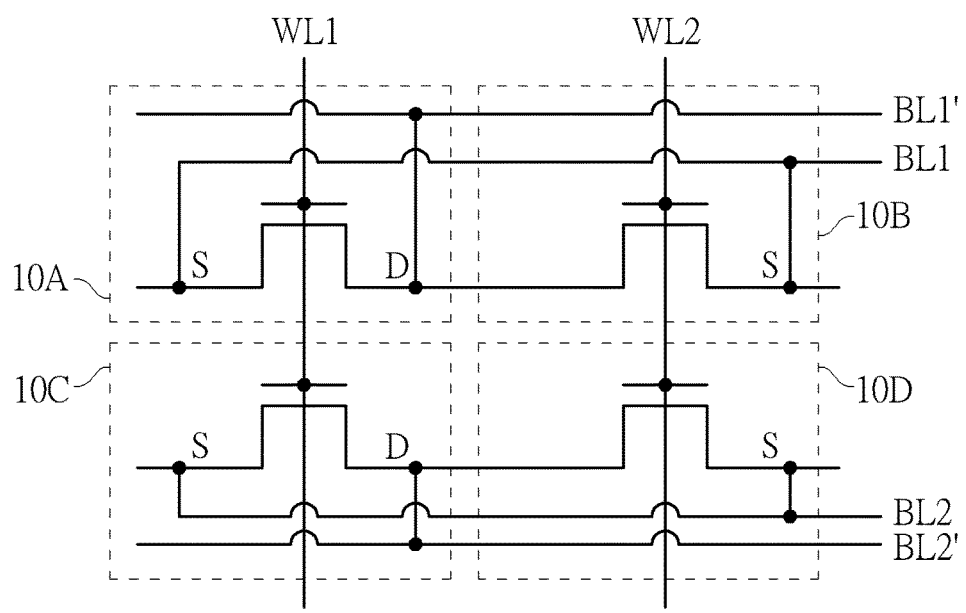
FIG. 6 shows the circuit diagram of a memory device according to one preferred embodiment of the present invention.

By the methods mentioned above, to one MOSFET 10, the electrons 50 can be stored in the first spacer 30 or in the second spacer 32 respectively, and the electrons 50 can also be removed from the first spacer 30 or from the second spacer 32 respectively. Therefore, the MOSFET 10 mentioned above can be made into a 2-bit memory cell. It will be described in the following paragraphs:

Please refer to FIGS. 6-7, FIG. 6 shows the circuit diagram of a memory device according to one preferred embodiment of the present invention, and FIG. 7 shows the operation table according the memory device shown in FIG. 5. As shown in FIG. 5, four memory cells 10A, 10B, 10C and 10D are provided and arranged in a matrix. Each memory cell is the same as the MOSFET 10 mentioned in FIG. 1. A first word line W1 is electrically connected to the gate of the memory cell 10A and the gate of the memory cell 10C; a second word line W2 is electrically connected to the gate of the memory cell 10B and the gate of the memory cell 10D; a bit line BL1 is electrically connected to the source of the memory cell 10A and the source of the memory cell 10B; a bit line BL1' is electrically connected to the drain of the memory cell 10A and the drain of the memory cell 10B (in this embodiment, the memory cell 10A and the memory cell 10B have a common drain); a bit line BL2 is electrically connected to the source of the memory cell 10C and the source of the memory cell 10D; a bit line BL2' is electrically connected to the drain of the memory cell 10C and the drain of the memory cell 10D (in this embodiment, the memory cell 10C and the memory cell 10D have a common drain).

As shown in FIGS. 6-7, when the memory device is in an erasing mode, all word lines (WL1 and WL2) and bit lines (BL1, BL1', BL2 and BL2') are electrically connected to the first voltage V1 (such as 7V). In other words, the first voltage V1 is applied to the gate, the source and the drain of each memory cell. As mentioned above, in this step, the electrons will be stored in the first spacer and the second spacer. Afterwards, in a programming mode, to a selected bit, for example, if memory cell 10A is selected, the gate of the memory cell 10A is electrically floated (labeled as "F" in FIG. 7), and one of the bit line BL1 or the bit line BL1' is electrically connected to the second voltage V2 (such as 5V), and the other bit lines are electrically floated too. Therefore, the electrons stored in the first spacer or the second spacer will be removed. It is noteworthy that for an un-selected memory cell, for example, the memory cell 10B is an un-selected memory cell, during the programming mode, the gate of the memory cell 10B is electrically connected to a third voltage V3 (the third voltage V3 can be deemed as an un-selected voltage in the following paragraph). The voltage V3 is smaller than the second voltage V2 but larger than 0V (e.g. 2.5V). Therefore, the third voltage V3 discharges parts of the second voltage V2, and decreases the voltage difference between the gate and the source/drain. In the memory cell 10B, the voltage difference between the gate and the source; or the voltage difference between the gate and the drain is not large enough to remove the electrons stored in the first spacer and the second spacer.

When memory device is in a read mode, to an un-selected memory cell, all the word lines (WL1 and WL2) and bit lines (BL1, BL1', BL2 and BL2') are electrically floated. To a selected memory cell, at first, a voltage Vcc is applied to turn on the gate of the memory cell. Next, a high potential voltage (such as logical "1" in FIG. 7) is applied to the source of the memory cell, and a low potential voltage (such as logical "0" in FIG. 7) is also applied to the drain of the memory cell, so as to make a current flow from the source to the drain; afterwards, exchanging the voltage to the source and the drain (i.e. applying a high potential voltage to the drain of the memory cell, and also applying a low potential voltage to the source of the memory cell), to make a current flow from the drain to the source. In this way, since the electrons are stored in the spacers of the memory cell, the current will influenced by the electrons (specifically, the depletion region will be influenced, and make the current increased or decreased). By observing the currents, whether the two spacers have electrons stored can be determined, and the value of the memory cell can be known.

Figure 8:
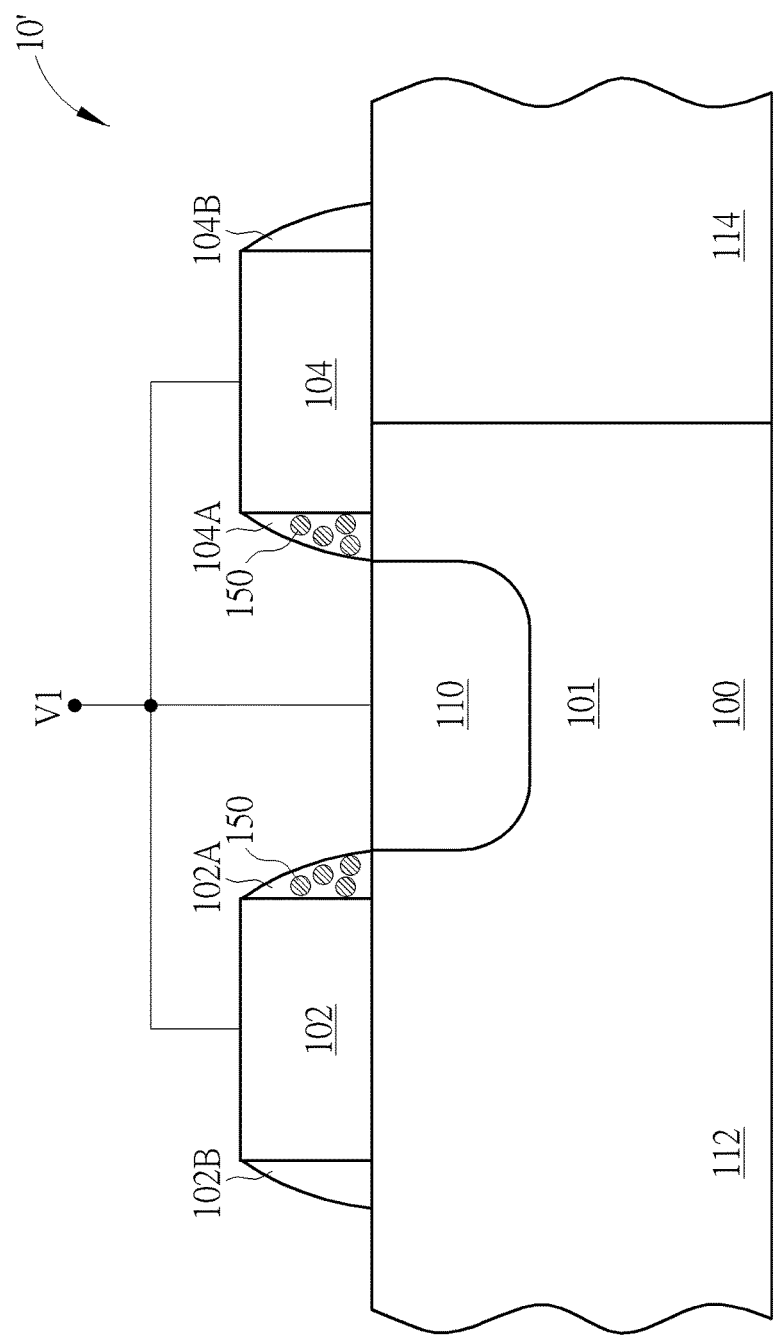
FIG. 8 shows a schematic diagram of the memory cell structure according to another embodiment of the present invention.

The memory cell mentioned above is a planar MSOFET, but in another embodiment of the present invention, the memory cell can also be applied in a finFET structure. Please refer to FIG. 8, which shows a schematic diagram of the memory cell structure according to another embodiment of the present invention. In this embodiment, the memory cell 10' is applied in a finFET structure. More precisely, a substrate 100 is provided with a fin structure 101 is formed on the substrate 10. A first gate structure 102 and a second gate structure 104 are disposed on the fin structure 101, each gate structure includes two spacer disposed on two sides of the gate structure respectively. For example, a spacer 102A and a spacer 102B are disposed on two sidewalls of the first gate structure 102, and a spacer 104A and a spacer 104B are disposed on two sidewalls of the second gate structure 104.

In addition, an epitaxial layer 110, such as a phosphorus silicide (SiP) is formed in the fin structure 101. In this embodiment, similar to the first preferred embodiment mentioned above, if a first voltage V1 is applied to the epitaxial layer 110, the gate of the first gate structure 102 and the gate of the second gate structure 104, a plurality of electrons 150 can be stored in the spacer 102A and in the spacer 104A. On the other hands, if the voltage difference between the gate of the epitaxial layer 110 and the first gate structure 102/or the second gate structure 104 is large enough (such as larger than 5V), the electrons 150 can be removed from the spacer 102A or the spacer 104A. Therefore, the structure shown in this embodiment can be made into a 1-bit memory cell or a 2-bit memory cell. The operating method of the memory cell in this embodiment are similar to those in the first preferred embodiment detailed above and will not be redundantly described.

Besides, in this embodiment, a first doped region (such as a p-well region) 112 and a second doped region (such as an n-well region) 114 are formed in the fin structure 101. The first gate structure 102 is disposed above the first doped region 112, and the second gate structure 104 is disposed on the interface between the first doped region 112 and the second doped region 114. The purpose for forming the first doped region 112 and the second doped region 112 is to decrease the resistance of the whole memory cell.

Furthermore, each spacer of the first gate structure 102 or the second gate structure 104 may be a single layer structure or a multiple layer structure, the material may include inter alia silicon nitride, silicon carbon nitride (SiCN), silicon oxide (SiO$_2$), silicon oxynitride (SiON), or silicon carbon oxynitride (SiOCN). In this embodiment, each spacer is a single silicon nitride layer, but not limited thereto. However, in another embodiment, if the spacer is a multiple layer structure, it should comprise at least one silicon nitride layer, and the electrons are stored in the silicon nitride layer.

In summary, the applicant found a phenomenon that when applying the voltage to a MOSFET, the electrons can be stored in the spacers of the MOSFET. Afterwards, the electrons stored in the spacers can be removed again by applying another voltage to the source or the drain of the MOSFET. Therefore, the MOSFET can be made into a 1-bit or 2-bit memory cell. The present invention provides the operation method of the memory cell. The structure and the operation method are applicable to the current semiconductor processes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory cell structure, comprising:
a fin structure;
a first gate structure and a second gate structure disposed on the fin structure;
a first storage element and a second storage element disposed between the first gate structure and the second gate structure, wherein the first storage element is disposed on one sidewall of the first gate structure, and the second storage element is disposed on another sidewall of the first gate structure, wherein the first storage element and the second storage element is selected from the group consisting of: silicon nitride, silicon carbon nitride (SiCN), silicon oxide (SiO$_2$), silicon oxynitride (SiON), and silicon carbon oxynitride (SiOCN); and
an epitaxial layer, disposed between the first gate structure and the second gate structure, and disposed in the fin structure.

2. The memory cell structure of claim 1, wherein the epitaxial layer, the first gate structure and the second gate are electrically connected to a voltage source.

3. The memory cell structure of claim 1, wherein the fin structure is doped, and the fin structure comprises two doping regions: a first doping region and a second doping region, wherein the first doping region has a first conductivity type, the second region has a second conductivity type, the first conductivity type and the second conductivity type are complementary to each other.

4. The memory cell structure of claim 3, wherein the epitaxial layer is disposed within the first doping region.

5. The memory cell structure of claim 3, wherein the first gate structure is disposed above the first doping region.

6. The memory cell structure of claim 3, wherein the second gate structure is disposed above parts of the first doping region and parts of the second doping region simultaneously.

7. The memory cell structure of claim 1, wherein the first spacer comprises a multiple layer structure, the multiple layer structure comprises at least one silicon nitride layer, and the electrons are disposed in the silicon nitride layer.

8. The memory cell structure of claim 1, wherein the second spacer comprises a multiple layer structure, the multiple layer structure comprises at least one silicon nitride layer, and the electrons are disposed in the silicon nitride layer.

9. A method for operating a memory cell structure, comprising:
providing a memory cell, wherein the memory cell comprises a substrate and a first gate structure disposed thereon, the first gate structure comprises a first gate electrode, a source region and a drain region disposed on two sides of the first gate electrode, a first spacer disposed between the first gate electrode and the source region, and a second spacer disposed between the first gate electrode and the drain region;

performing an erasing process, to apply an erasing voltage to the first gate electrode, the source region and the drain region simultaneously, to attract a plurality of electrons from the substrate, and to store a plurality of electrons in the first spacer and the second spacer;

performing a programming process, to apply a pull-out voltage to the source region, and to remove the electrons stored in the first spacer, or to apply the pull-out voltage to the drain region, so as to remove the electrons stored in the second spacer; and performing a read process, to determine whether the plurality of electrons is stored in the first spacer and stored in the second spacer.

10. The method of claim 9, wherein the memory cell further comprises a plurality of second gate structures, the first gate structure and the plurality of second gate structures are arranged in a matrix.

11. The method of claim 10, wherein each second gate structure has a second gate electrode.

12. The method of claim 11, wherein during the programming process, an un-select gate voltage is applied to each second gate electrode, wherein the un-select gate voltage is smaller than the pull-out voltage.

13. The method of claim 9, wherein during the programming process, the first gate electrode is electrically floated or grounded.

14. The method of claim 13, wherein the pull-out voltage is larger than 5V.

15. The method of claim 9, wherein during the erasing process, the substrate is electrically grounded.

16. The method of claim 15, wherein the erasing voltage is larger than 7V.

17. The method of claim 9, wherein the read process comprising:

applying a first voltage to the source region, and applying a second voltage to the drain region, wherein the first voltage is larger than the second voltage; and applying a third voltage to the source region, and applying a fourth voltage to the drain region, wherein the fourth voltage is larger than the third voltage.

* * * * *